United States Patent [19]
Nishi et al.

[11] Patent Number: 5,616,264
[45] Date of Patent: Apr. 1, 1997

[54] METHOD AND APPARATUS FOR CONTROLLING TEMPERATURE IN RAPID HEAT TREATMENT SYSTEM

[75] Inventors: Katsuo Nishi, Tokyo; Kazuo Terada, Kumamoto-ken; Wataru Ohkase; Kenichi Yamaga, both of Sagamihara, all of Japan

[73] Assignees: Tokyo Electron Limited; Tokyo Electron Tohoku Limited, both of Japan

[21] Appl. No.: 259,180

[22] Filed: Jun. 13, 1994

[30] Foreign Application Priority Data

| Jun. 15, 1993 | [JP] | Japan | 5-168615 |
| Jun. 15, 1993 | [JP] | Japan | 5-168616 |
| Jun. 28, 1993 | [JP] | Japan | 5-178482 |
| Jun. 30, 1993 | [JP] | Japan | 5-186772 |
| Jul. 9, 1993 | [JP] | Japan | 5-193996 |
| Jul. 19, 1993 | [JP] | Japan | 5-200059 |
| Sep. 9, 1993 | [JP] | Japan | 5-250029 |

[51] Int. Cl.$^6$ .................................................. H05B 1/02
[52] U.S. Cl. .......................... 219/494; 219/497; 219/486; 219/483; 392/417; 373/136
[58] Field of Search ................................. 219/494, 497, 219/501, 505, 506, 508, 483–486; 392/416, 417, 390, 392; 373/136, 137

[56] References Cited

U.S. PATENT DOCUMENTS

| 5,233,163 | 8/1993 | Mieno et al. ........................... 219/390 |
| 5,323,484 | 6/1994 | Nakao et al. . |
| 5,446,825 | 8/1995 | Moslehi et al. ........................ 392/416 |

FOREIGN PATENT DOCUMENTS 4-186616   7/1992   Japan .

*Primary Examiner*—Mark H. Paschall
*Attorney, Agent, or Firm*—Graham & James LLP

[57] ABSTRACT

A temperature control method in a rapid heat treatment apparatus comprising simulatively heating dummy wafers in a process tube and previously detecting and grasping by temperature sensors a wafer temperature rising pattern, a heater temperature rising pattern and an internal atmosphere temperature rising pattern, arranging wafers to be processed in the process tube, detecting a temperature of each zone and that of each heater element by the temperature sensors, upon heating the wafers, and controlling each heater element on the basis of the detected temperatures and the wafer, heater and internal atmosphere temperature rising patterns by a controller to rapidly and uniformly raise the temperature of each wafer until the temperature of the wafers in each zone reaches the intended one and becomes stable.

16 Claims, 15 Drawing Sheets

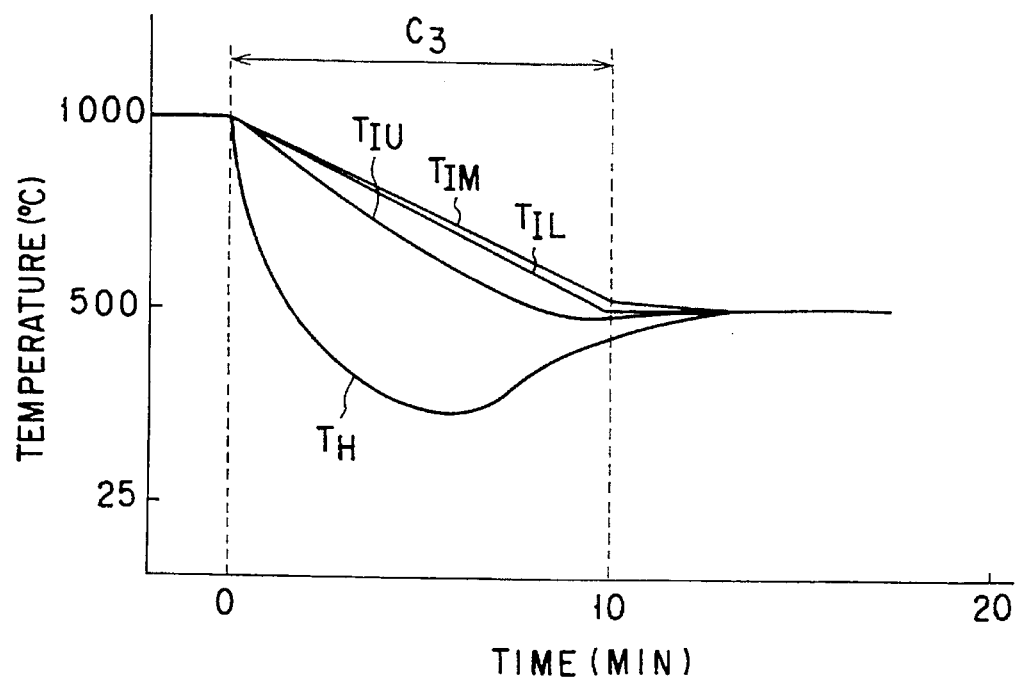
F I G. 3

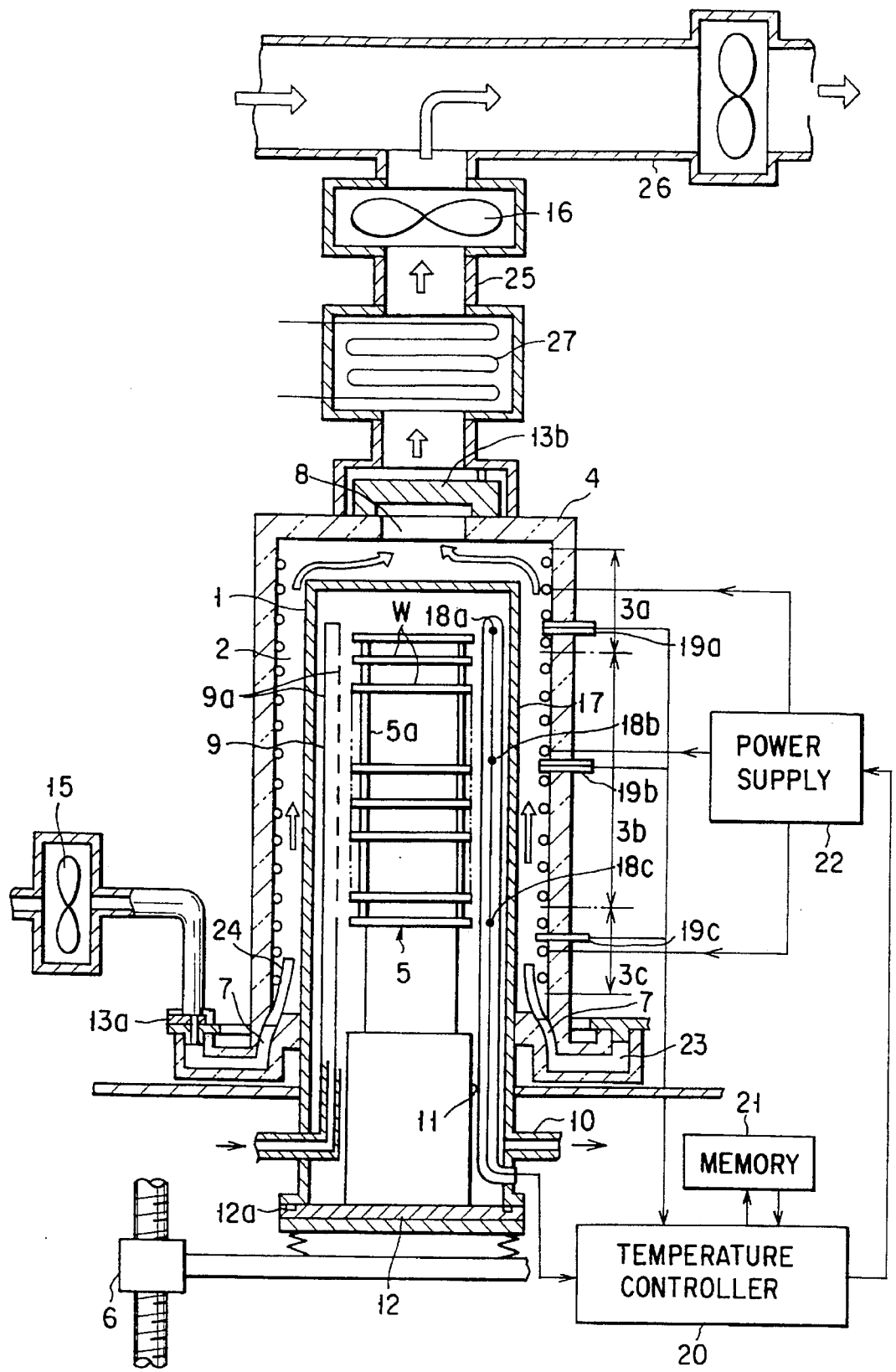
F I G. 2

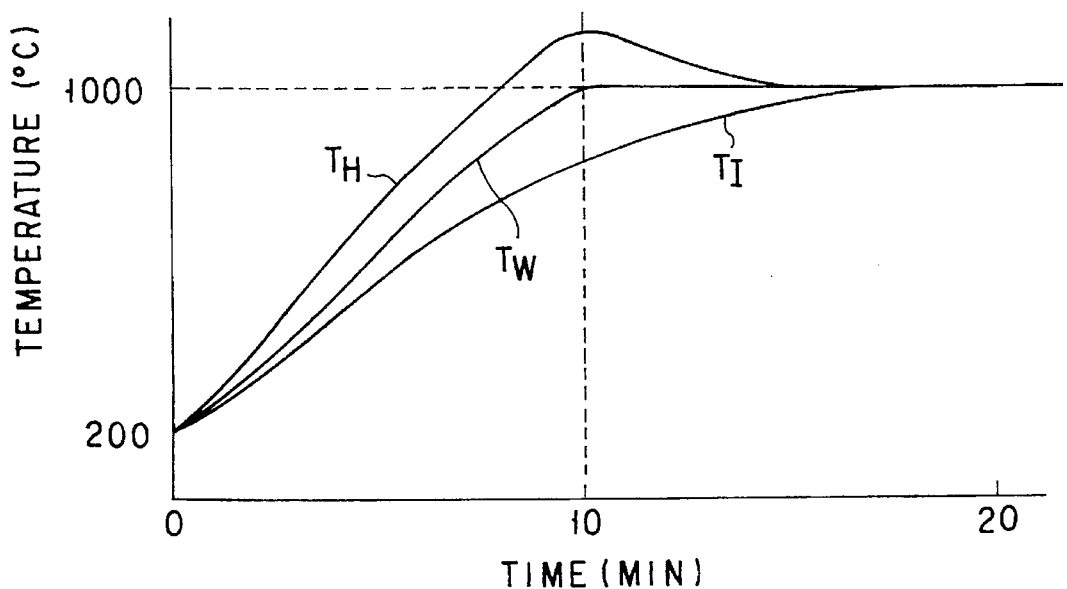
F I G. 6

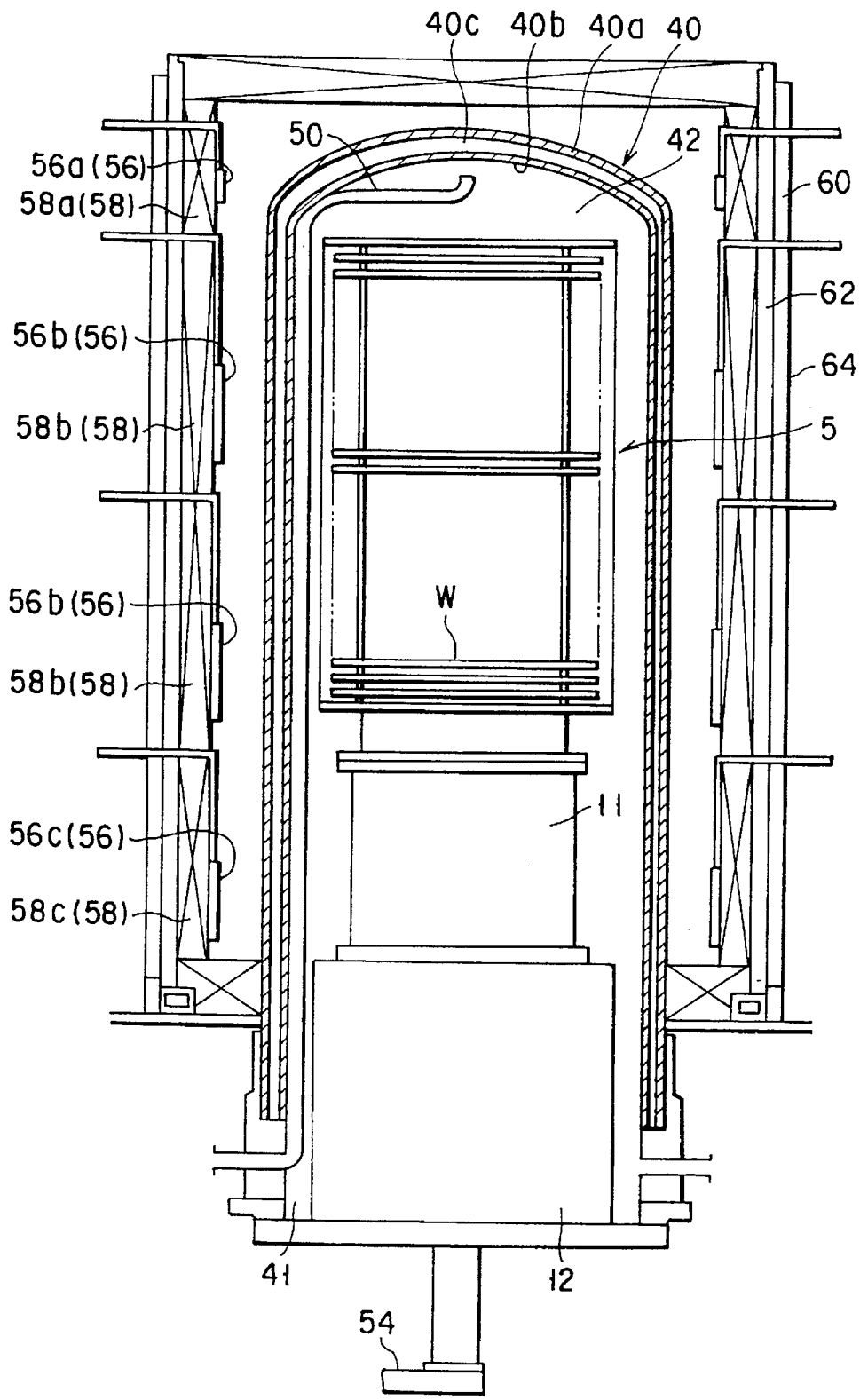
F I G. 7

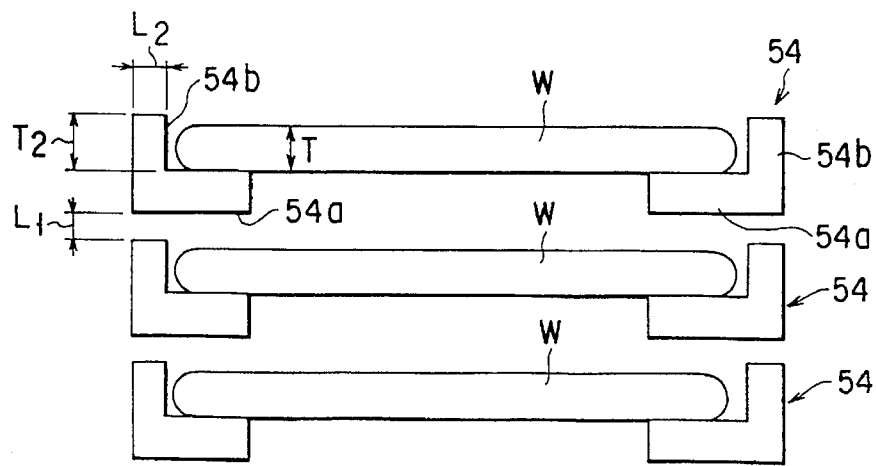
F I G. 11
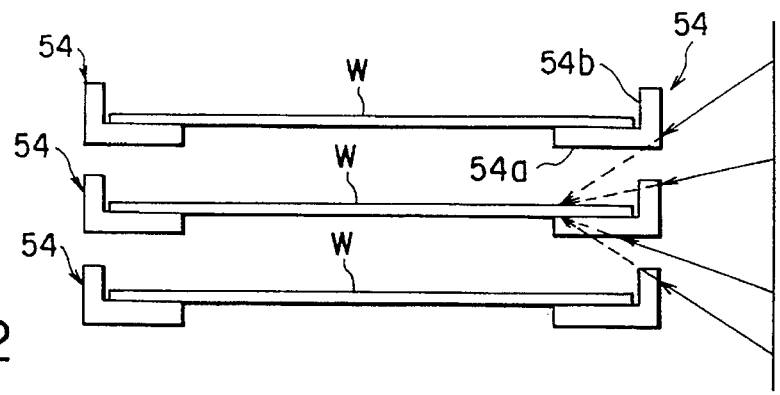
F I G. 12
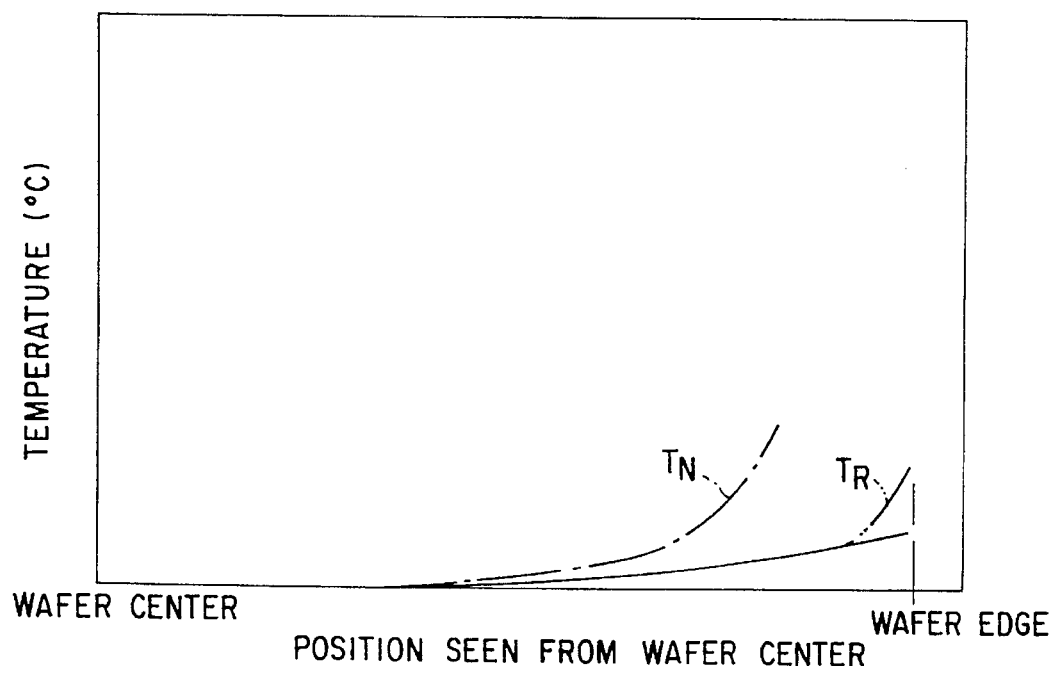
F I G. 13

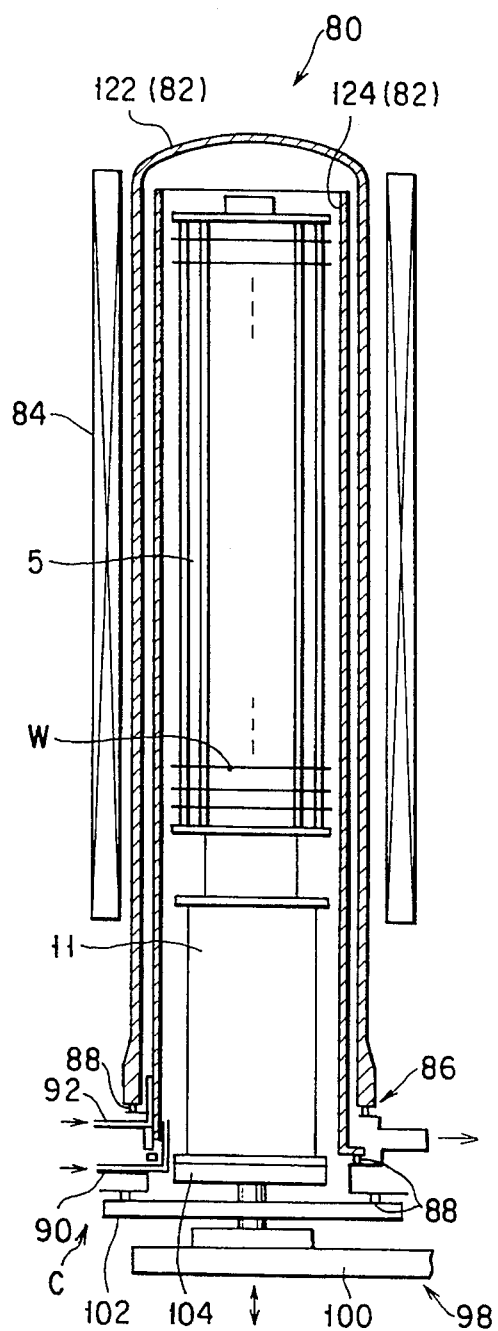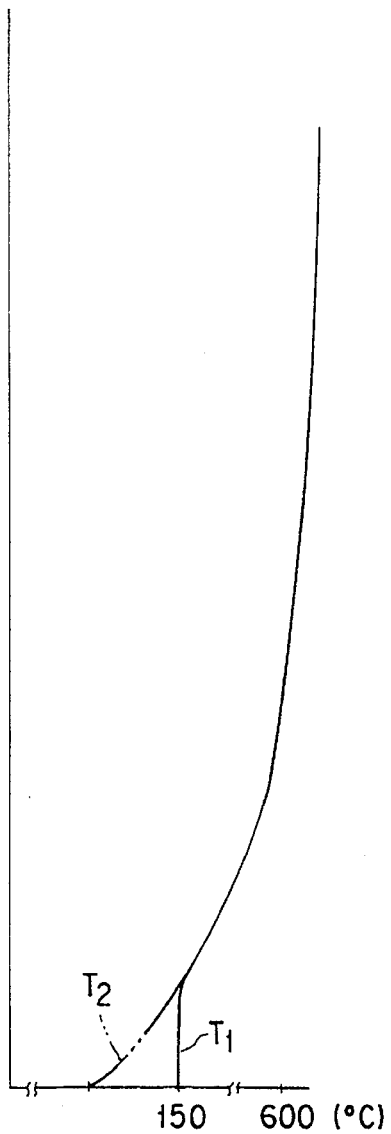
F I G. 14A  F I G. 14B

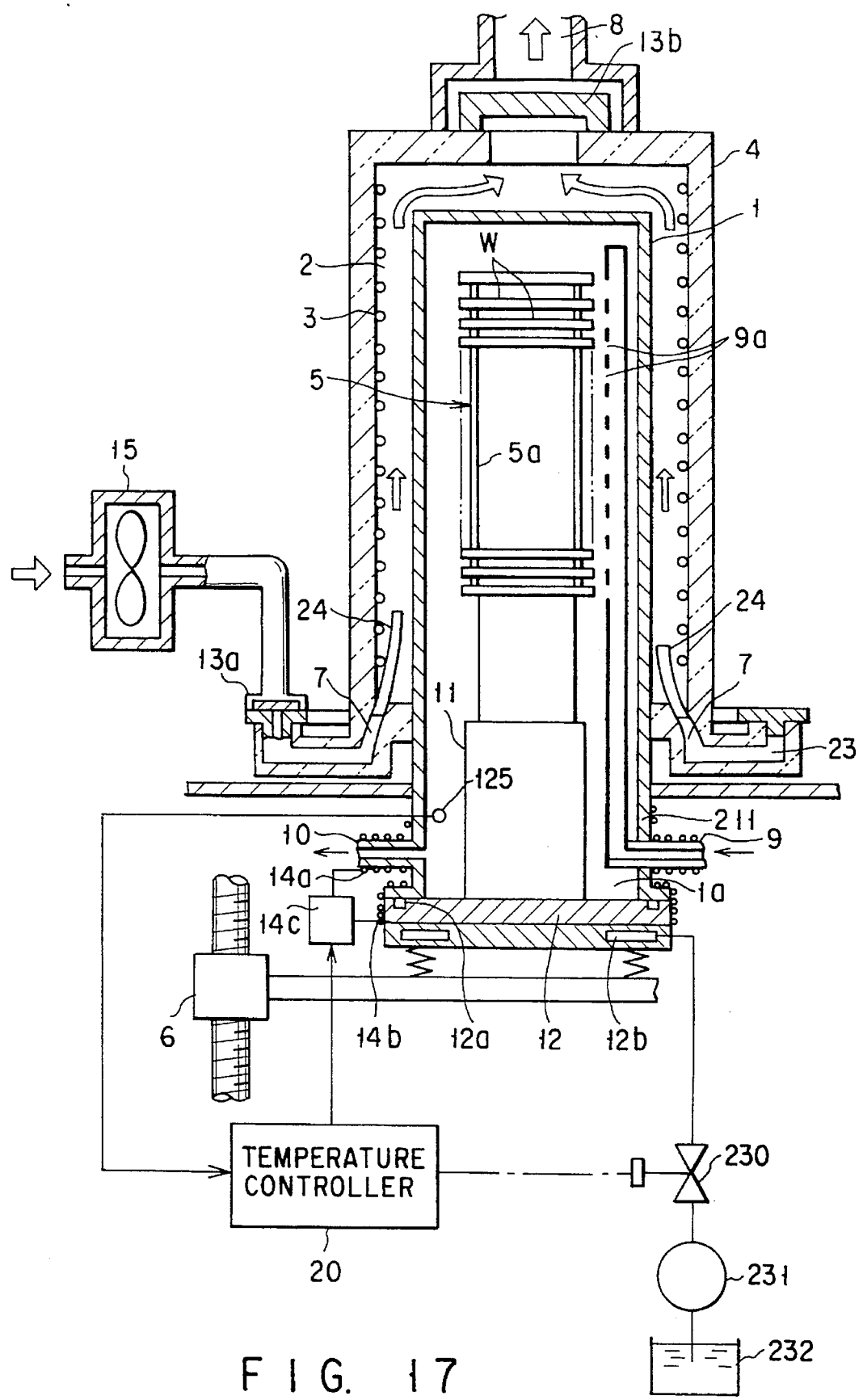
F I G. 17

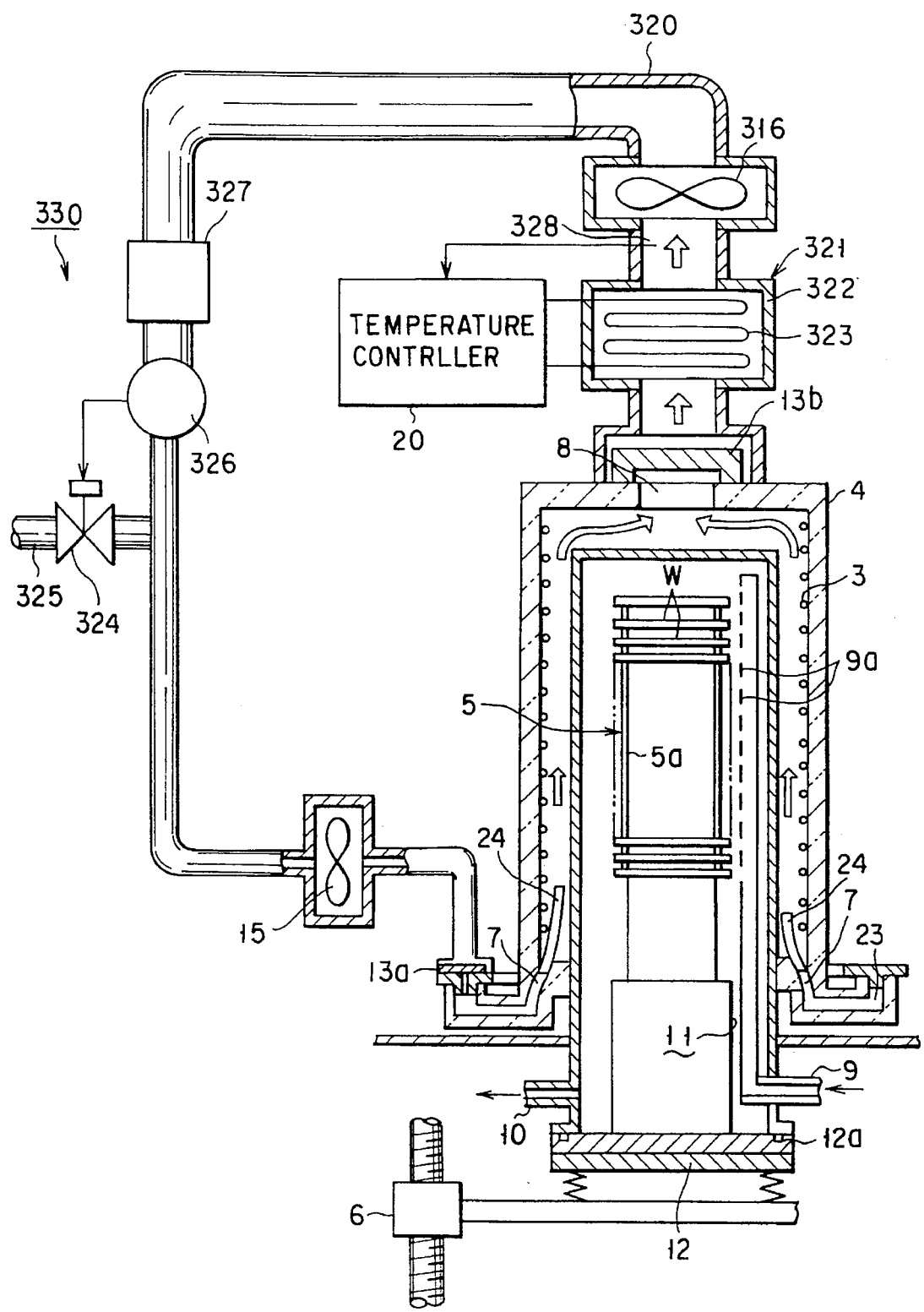
F I G. 19

METHOD AND APPARATUS FOR CONTROLLING TEMPERATURE IN RAPID HEAT TREATMENT SYSTEM

BACKGROUND OF THE INVENTION

1. Field of the Invention

The present invention relates to method and apparatus for controlling temperature in a rapid furnace.

2. Description of the Related Art

Various kinds of heat treatment apparatus are used to form a diffusion layer, silicon oxide and nitride films on each semiconductor wafer and glass substrate in them. The CVD, oxide film forming and heat diffusion treatment apparatuses are used in the course of making semiconductor devices, for example.

Jpn. Pat. Appln. KOKAI Publication No. Hei 3-82016, for example, discloses a heat treatment apparatus of the vertical type in which a plurality of wafers are processed in a batch. When this apparatus is to be used to apply impurities diffusing process to the wafers, supply and exhaust openings of the vertical heat treatment furnace are closed by shutters and the wafers are loaded together with the boat into the process tube. When the inside of the process tube is then heated to a process temperature by heaters and process gas as introduced into the process tube, process gas acts on the wafers to diffuse impurities into them.

As integrated circuits are made higher in their process speed and their integration is also made higher, it is asked that the depth of diffusing impurities into the surface of each wafer is made as small as possible. In order to control this impurities diffusing depth, it is needed that the wafers are heated to a temperature (or 1000° C., for example) higher than the intended one and that their predetermined temperature gradient, that is, the time during which they are kept at the intended temperature (or 500° C., for example) and their temperature falling time are controlled by forced cooling. Conventionally, fans were arranged in supply and exhaust openings of the vertical heat treatment furnace for this purpose to forcedly introduce cooling air into the space between the process tube and the outer housing through the supply openings.

When the wafers are forcedly cooled by the fans in this manner, however, the temperature of the wafers becomes remarkably different from that of the heater (more specifically, the temperature of the thermocouple arranged in the heater section) and it thus takes a long time (20 minutes) that the wafers and the heater are cooled to same temperature (25° C.). As shown in FIG. 1, therefore, the heater is forcedly air-cooled to lower heater temperature $T_H$ to 500° C. by the fan for an initial cooling period $C_1$ starting after the heater power source is turned off, and the ON-OFF operation of the fan is then repeated to control the heater temperature $T_H$ at about 500° C. for an another cooling period $C_2$ following the initial one $C_1$. This ON-OFF operation of the fan is repeated until wafer temperature $T_W$ falls to 500° C. Conventionally, the ON-OFF operation of the fan must be frequently carried out as described. In addition, temperature dropping control takes a long time. The productivity of wafers is thus lowered.

Further, a plurality of wafers are processed at the same time in the vertical heat treatment furnace of this kind. Therefore, wafers located at upper (top), center or lower (bottom) portion (zone) are made different in temperature from those located at other zones. The productivity of wafers is thus lowered.

In a heat treatment apparatus disclosed by Jpn. Pat. Appln. KOKAI Publication No. Hei 4-186616, a uniformly-heating member made of SiC is interposed between a heating resistance and the process tube to prevent the wafers from being heated to temperatures quite different at the top, center and bottom zones in the process tube. This uniformly-heating member serves to uniformly apply heat to all of the wafers in the process tube and also to prevent unnecessary matters spread from the heating resistance and a heat insulator from entering into the process tube.

A heater element made of FeCrAl alloy is usually used as the heating resistance in the heat treatment apparatus. The FeCrAl alloy heater element has a surface load of about 2 W/cm² at 1200° C. Recently, however, a heat treatment apparatus capable of attaining a temperature raising and dropping speed of at least 30° C./minute (more preferably 100° C./minute (at temperature raising time) and 60° C./minute (at temperature dropping time)) is expected and attention is now paid to molybdenum disilicide which has a surface load (of 20 W/cm²) larger than that of the FeCrAl alloy heater element.

When the uniformly-heating member is interposed between the wafers and the heating resistance, however, the temperature raising speed of the wafers is made lower for the initial period. In addition, the uniformly-heating member makes it more difficult for infrared rays emitted from the heating resistance to enter into the process tube through it.

When no uniformly-heating member is used, metal ions such as Fe, Cu and Na caused from the heating resistance and its support enter into the process tube through the quartz-made wall thereof to thereby contaminate the wafers in the tube by heavy metal.

SUMMARY OF THE INVENTION

An object of the present invention is therefore to provide method and apparatus for controlling temperature in a rapid heat treatment system to rapidly and uniformly raise and drop the temperature of each wafer in a process tube of the system and to increase the throughput and productivity of wafers to a greater extent.

Another object of the present invention is to provide a rapid heat treatment apparatus capable of preventing the wafers from being contaminated by heavy metal.

According to the present invention, there can be provided a method of controlling temperature in a rapid heat treatment apparatus comprising simulatively heating dummy substrates in a process tube by plural heater means and previously detecting and grasping by temperature detector means a substrate temperature rising pattern obtained every zone until the dummy substrates reach an intended temperature and also a heater temperature rising pattern obtained every zone until heat generating portions of the heater means reach the intended temperature and also an internal atmosphere temperature rising pattern obtained every zone until an atmosphere in the process tube reach the intended temperature; arranging substrates to be processed in the process tube; detecting a temperature of each zone in the process tube and temperature of the heat generating portion of each heater means by the temperature detector means, upon heating the substrates; and controlling each of the heater means on the basis of the detected temperatures, the substrate temperature rising pattern, the heater temperature rising pattern and the internal atmosphere temperature rising pattern obtained every zone until an atmosphere in the process tube reach the intended temperature by a control means to rapidly and uniformly raise the temperature of each substrate until the temperature of the substrates in each zone reaches the intended one and becomes stable.

Each of the heater means is controlled as follows. Three temperature detector means are arranged adjacent to their corresponding substrates in the process tube to detect temperatures of the substrates located at top, center and bottom zones in the process tube. The temperature rising speed of the substrates located at the top zone is the lowest, that of those at the bottom zone comes next and that of those at the center zone comes next. When the amount of power supplied to the heater at the top zone is made large, therefore, all of the wafers at these three zones can be more uniformly heated. Further, the heating of the wafers can be controlled responsive to the temperature $T_H$ of each heater element detected, thereby enabling the substrate temperature $T_W$ to more rapidly reach the intended one.

Furthermore, the process tube may be cooled by a fan means while heating the wafers in it.

According to the present invention, there can also be provided a rapid heat treatment apparatus comprising a process tube of the vertical type having inner and outer walls and at least an opening, and into which a plurality of substrates are loaded; a heat insulator unit arranged round the process tube of the vertical type; a heat resistance unit arranged between the heat insulator unit and the process tube of the vertical type and having a surface load larger than 10 W/cm² and serving to heat the process tube; a lifter unit for carrying the substrates on a boat into and out of the process tube of the vertical type through the opening thereof; and a gas supply means for supplying gas into a space between the outer and the inner wall of the process tube of the vertical type.

Preferably, reactive gas such as halogen group gases reactive to metal ions, oxygen gas and air are used as supply gas. Instead of these reactive gases, non-reactive gas such as nitrogen and argon gases may be used.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a sectional block diagram showing the rapid heat treatment furnace according to a first embodiment of the present invention;

FIG. 3 is a temperature hysteresis view intended to explain the temperature control method according to an embodiment of the present invention;

FIG. 6 is a temperature hysteresis view showing results practically measured relating to heater temperature $T_H$, tube inside temperature $T_I$ and wafer temperature $T_W$ at the rapid heating time;

FIG. 7 is a sectional view showing the rapid heat treatment furnace according to a third embodiment of the present invention;

FIG. 11 is a partly-sectioned view showing wafers mounted on ring-shaped trays;

FIG. 12 is a partly-sectioned view intended to explain how radiation heat rays enter onto the wafer on the ring-shaped tray;

FIG. 13 is a characteristic temperature view showing temperature distributions obtained in the plane of the wafer mounted on the ring-shaped tray and also in the plane of the wafer not mounted on it;

FIG. 14A is a sectional view showing the heat treatment apparatus according to a further embodiment of the present invention;

FIG. 14B is a characteristic temperature view showing temperature distributions in the heat treatment apparatus along the longitudinal direction thereof;

FIG. 17 is a sectional block diagram showing the heat treatment apparatus according to a still further embodiment of the present invention;

FIG. 19 is a partly-sectioned view showing the heat treatment apparatus according to a still further embodiment of the present invention;

DETAILED DESCRIPTION OF THE PREFERRED EMBODIMENTS

Figure 1:
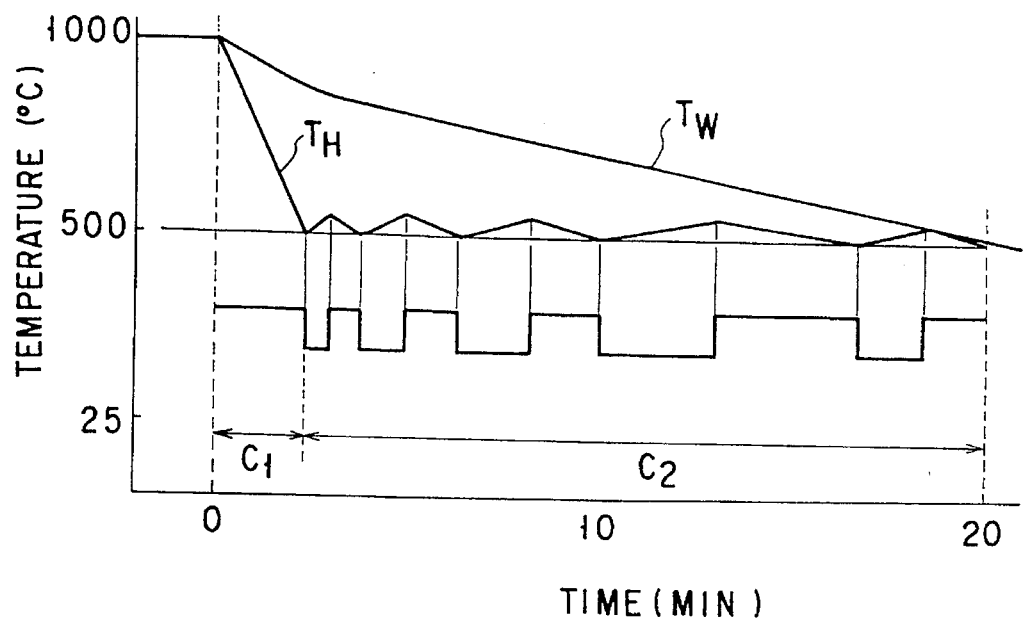
FIG. 1 is a temperature hysteresis view intended to explain the conventional temperature control method.

Some embodiments of the present invention will be described with reference to the accompanying drawings.

The heat treatment system according to a first embodiment of the present invention shown in FIG. 2 is intended to house a vertical type wafer boat 5 and apply heat treatment to a plurality of wafers W on the boat 5 at once. It includes a temperature control system which is provided with a temperature controller 20, and it is intended to heat-treat the wafers W at high speed. It further includes a process tube 1 made of quartz, heaters 3a, 3b, 3c, an outer housing 4 and a boat lifter unit 6.

A clearance 2 is formed between the process tube 1 and the outer housing 4. Cooling air supply openings 7 are communicated with the clearance 2 at the bottom, of the outer housing 4 and an exhaust opening 8 is communicated with the clearance 2 at the top thereof. A fan 15 is communicated with the cooling air supply openings 7 through a pipe and another fan 16 is communicated with the exhaust opening 8 through a heat exchanger 27 and a duct 25. This exhaust line including the fan 16 is further communicated with a collecting exhaust duct 26.

The temperature control system includes a heater unit comprising upper, center and lower heaters 3a, 3b and 3c, to which power is applied from a power supply 22. It also includes a temperature detector means comprising inner upper, inner center and inner lower thermocouples 18a, 18b and 18c arranged in the process tube 1. These inner thermocouples 18a–18c are connected to the input side of the temperature controller 20. Temperatures of heaters 3a–3c are detected by heater thermocouples 19a–19c and signals representing their temperatures detected are applied to the temperature controller 20.

The temperature controller 20 includes a microcomputer (not shown), in which various kinds of data collected by tests previously conducted according to a program are stored in a memory 21. Comparing these data stored with temperatures detected, the temperature controller 20 controls the power source 22. In short, temperatures $T_{IU}$, $T_{IM}$ and $T_{IL}$ of wafers W located at upper, center and lower sections in the process tube 1 are applied to a CPU of the microcomputer together with the temperature $T_H$ of the heater unit.

Eight cooling air supply openings 7 are arranged in the bottom of the outer housing or furnace frame 4 and they are communicated with a ring-shaped space 23 arranged round the bottom portion of the frame 4. A nozzle 24 extends from each of the supply openings 7 into the clearance 2 to enable cooling air supplied through the fan 15 to uniformly flow into the clearance 2. The exhaust opening 8 is connected to the exhaust duct 26, which runs through the factory, through a shutter 13b and the duct 25. The duct 25 includes the heat exchanger 27 and this heat exchanger 27 serves to cool that exhausted air to room temperature which has been heated high while cooling the wafers W in the tube 1. It also includes the exhaust fan 16 which serves to smoothly guide the exhausted air into the exhaust duct 26.

A reaction gas introducing pipe 9 is inserted into the process tube 1. It has a plurality of gas introducing apertures 9a formed along it at a same pitch. An exhaust pipe 10 is communicated with the process tube 1, which is made vacuum by a pumping means such as the vacuum pump connected to the exhaust pipe 10.

The wafer boat 5 is mounted on a lid 12 made of quartz through a heat insulating sleeve 11. The lid 12 cooperates with an O-ring 12a to close the open bottom of the process tube 1 air-tight.

It will be described how the temperature control apparatus is operated.

Shutters 13a and 13b are closed to close the supply and exhaust openings 7 and 8. The wafer boat 5 is lifted into the process tube 1 by the lifter unit 6. The heater power source 22 is turned on to heat the inside of the process tube 1 to a temperature (1000° C., for example) higher than a predetermined temperature (500° C.) by means of the heaters 3a–3c. The supply and exhaust openings 7 and 8 are then opened by the shutters 13a and 13b so that air can be introduced into the clearance 2 to forcedly cool the process tube 1 and the wafers W in it.

As shown in FIG. 3, wafer temperatures $T_{IU}$, $T_{IM}$ and $T_{IL}$ are detected and signals representing these temperatures detected are applied to the temperature controller 20. Responsive to these signals, the controller 20 controls the amount of power supplied from the power source 22 to each of the upper, center and lower heaters 3a, 3b and 3c. The temperature $T_{IM}$ of waters located at the center portion of the tube 1 is made the highest, the temperature $T_{IL}$ or $T_{IU}$ of wafers located at the lower portion or upper portion thereof higher and the temperature $T_{IU}$ or $T_{IL}$ of wafers located at the upper portion or lower portion thereof high. To achieve this, the amount of power supplied to each of the heaters 3a–3c is controlled. All of the wafers W in the process tube 1 can be thus uniformly heated.

While keeping the wafers heated to an intended temperature in this manner, reactive gas is introduced into the process tube 1 through the pipe 9 to diffuse impurities in the surface of each of the wafers W. When this diffusion treatment is finished, the power source 22 is turned off and the process tube 1 is purged while introducing purge gas such as nitrogen ($N_2$) gas into the tube 1. When temperature in the process tube 1 is lowered to 25° C., the wafer boat 5 is moved down, together with the wafers W, out of the tube 1 by the lifter unit 6.

A second embodiment of the present invention will be described referring to FIGS. 4 through 6. Same components as those of the first embodiment will be described only when needed.

Figure 4:
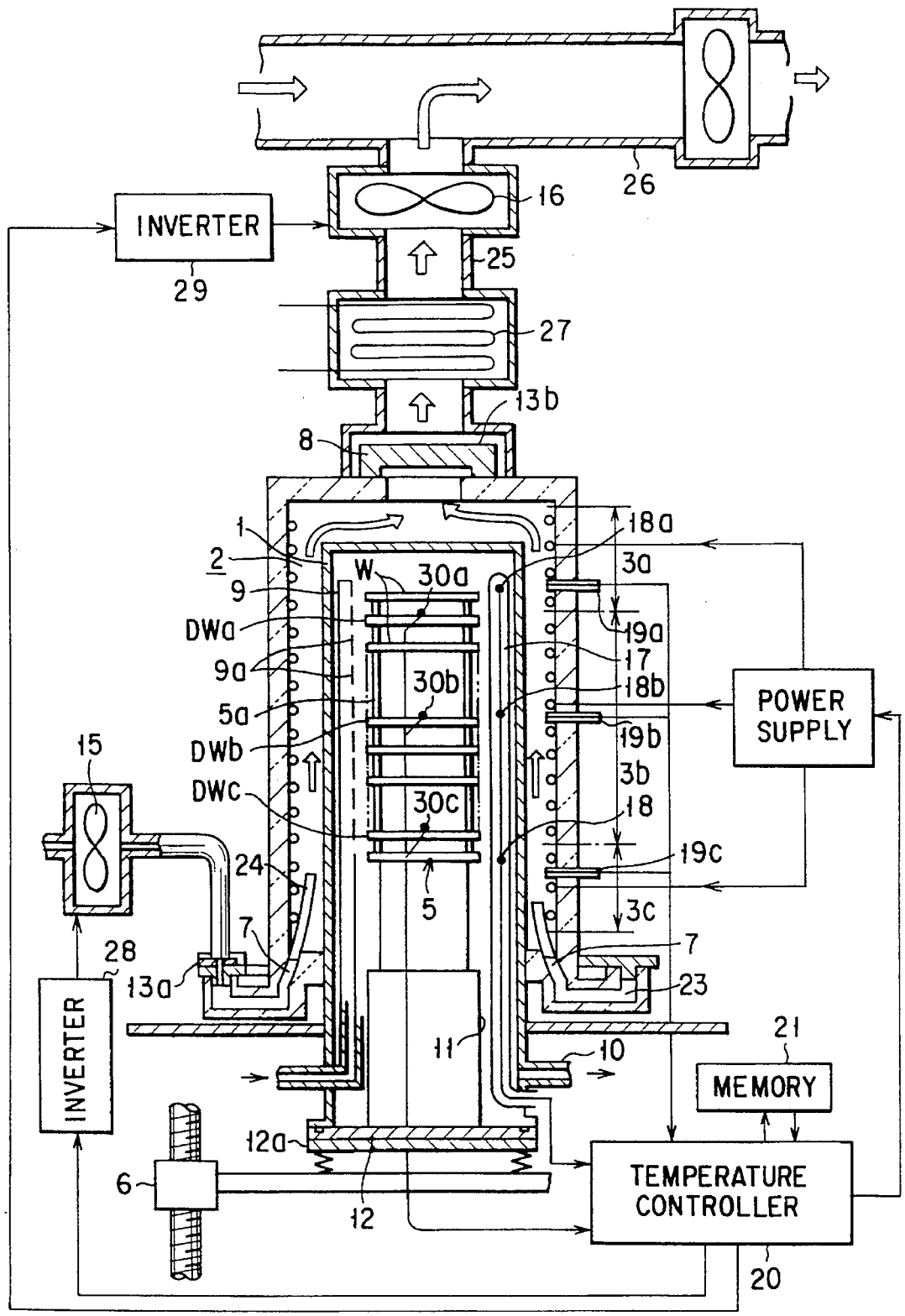
FIG. 4 is a sectional block diagram showing the rapid heat treatment furnace according to a second embodiment of the present invention.

In the temperature control apparatus according to the second embodiment of the present invention shown in FIG. 4, an inverter 28 is interposed between the supply fan 15 and the temperature controller 20. In addition, another inverter 29 is interposed between the exhaust fan 16 and the temperature controller 20. These inverters 28 and 29 are intended to control amounts of air supplied and exhausted by the fans 15 and 16, responsive to command signals applied from the temperature controller 20.

In the case of this second temperature control apparatus, signals representing temperatures detected by the upper, center and lower inner thermocouples 18a–18c are applied to the temperature controller 20. Responsive to these signals applied, the temperature controller 20 controls the heater power source 22, that is, temperatures of the upper, center and lower heaters 3a–3c. At the same time, it also frequency-controls the inverters 28 and 29. In short, it changes the number of rotation of each of the supply and exhaust fans 15 and 16. The amount of cooling air supplied by the supply fan 15 can be thus controlled while controlling the amount of air exhausted by the exhaust fan 16.

Temperatures of heaters 3a–3c are detected by the thermocouples 19a–19c which are arranged adjacent to their corresponding heaters 3a–3c, and signals representing these temperatures detected are applied to the temperature controller 20. This controller 20 includes a micro-computer (not shown) connected to the external memory 21. The memory 21 stores temperatures $T_W$ ($T_{Wh}$, $T_{Wm}$, $T_{Wl}$) of wafers located at the upper (or high), center (or middle) and lower portions of the process tube 1, temperatures $T_H$ ($T_{Hh}$, $T_{Hm}$, $T_{Hl}$) detected by the thermocouples 19a–19c, and temperatures $T_I$ ($T_{Ih}$, $T_{Im}$, $T_{Il}$) detected by the thermocouples 18a–18c. These values stored are prepared as temperature data before the diffusion process is practically conducted. The microcomputer in the temperature controller 20 is programmed to control the heater power source 22 while comparing temperatures $T_I$ detected by the thermocouples 18a–18c with the temperature data stored and arithmetically calculating them.

Three heater means 3a–3c and three temperature detector means 18a–18c are used in the above-described temperature control apparatus, but they may be used as two, four or five units.

As dummy wafers DW used to previously measure the wafer temperature $T_W$, upper, center and lower ones (DWa, DWb, DWc) are provided. Wafer thermocouples 30a, 30b and 30c are attached to the data-preparing dummy wafers DWa, DWb and DWc. Temperatures $T_{Wh}$, $T_{Wm}$ and $T_{Wl}$ detected by the wafer thermocouples 30a, 30b and 30c are applied to the temperature controller 20.

Figure 5:
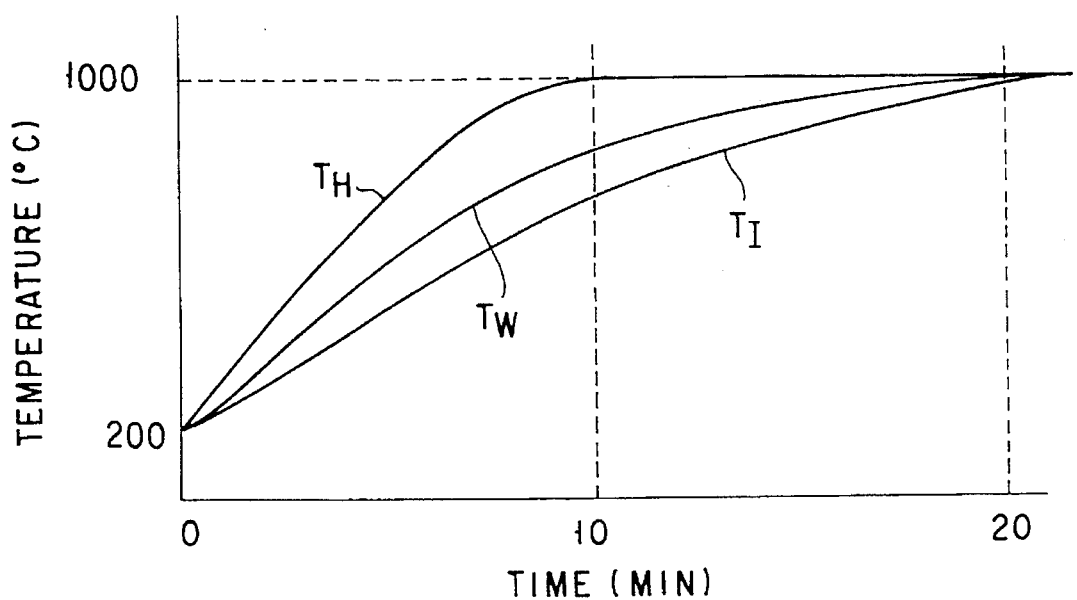
FIG. 5 is a temperature hysteresis view showing results practically measured relating to heater temperature $T_H$, tube inside temperature $T_I$ and wafer temperature $T_W$ at the rapid heating time.

Referring to FIGS. 5 and 6, it will be described how the wafer temperature $T_W$ is controlled when the wafers are heated rapidly.

As shown in FIG. 5, when a plurality of wafers W are to be heated to the intended temperature in a short while by heaters 3a, 3b and 3c in the conventional case, the heater temperature $T_H$, the internal atmosphere temperature $T_I$ of the process tube, and the wafer temperature $T_W$ change. As apparent from FIG. 5, it takes about 10 minutes that the heater temperature $T_H$ rises from its initial one 200° C. to the intended one 1000° C. When another 10 minutes passes from then, the wafer temperature $T_W$ reaches the intended one 1000° C. and immediately after then, the internal atmosphere temperature $T_I$ also reaches the intended one 1000° C. Measured results of these temperatures $T_W$, $T_H$ and $T_I$ become same at all times, providing that conditions such as the structure of the heat treatment furnace used, the number of matters to be processed, and the speed at which the heater means are heated are kept same. When the internal atmosphere temperature $T_I$ is announced at a time point of the heating process, therefore, the heater temperature $T_H$ and the wafer temperature $T_W$ at that time point can be automatically gained.

Referring to FIG. 6, it will be described how the wafer temperature $T_W$ is controlled by a temperature control method of the present invention.

Temperature data to be stored in the memory 21 are prepared before the heating and diffusion process is practiced. The supply and exhaust openings 7 and 8 are closed by the shutters 13a and 13b. The dummy wafers DWa, DWb and DWc are attached to the wafer boat 5 at the upper, center and lower portions thereof. The boat 5 is then loaded into the process tube 1.

While keeping the temperature controller 20 under temperature data preparing mode, the intended temperature is set 1000° C. and the heater power source 22 is turned on. At the same time, temperature measurements by the wafer thermocouples 30a–30c, the inside ones 18a–18c and the heater ones 19a–19c are started. Measurement data obtained by these thermocouples 30a–30c, 18a–18c and 19a–19c are converted into temperature control ones by the microcomputer of the temperature controller 20 and stored in the memory 21. The temperature control data represent the correlation of the wafer, inside and heater temperatures $T_W$, $T_I$ and $T_H$ at each time point and correspond to temperature hysteresises of them shown in FIGS. 5 and 6. When the temperature control data are collected, while conducting temperature measurements, until the wafer temperature $T_W$ becomes equal to the intended one, the heater power source 22 is turned off. The wafer boat 5 is unloaded out of the process tube 1 and the dummy wafers DWa, DWb and DWc are detached from the boat 5.

The heating and diffusion process is then practiced. The supply and exhaust openings 7 and 8 are closed by the shutters 13a and 13b. Wafers W which are not processed yet are put on the wafer boat 5, which is then loaded into the process tube 1. The temperature controller 20 is made under practice mode and the intended temperature is set. The heater power source 22 is turned on to start heating. The temperature controller 20 monitors the internal atmosphere temperatures $T_I$ for this while through the internal thermocouples 18a, 18b and 18c. The heaters 3a, 3b and 3c are thus controlled in temperature on the basis of the internal atmosphere temperature $T_I$ and the data stored in the memory 21 to heat the wafers W to the intended temperature.

When amounts of power supplied to the heaters 3a, 3b and 3c are controlled, as shown in FIG. 6, while controlling the number of rotation of each of the fans 15 and 16, it is supposed that the heater temperature $T_H$ exceeds the intended one 1000° C. in a short while and that the wafer temperature $T_W$, therefore, reaches the intended one 1000° C. for about 10 minutes. However, the number of rotation of each of the fans 15 and 16 is controlled responsive to the speed at which the wafers W are raised in temperature. When the wafer temperature $T_W$ reaches the intended one 1000° C., therefore, it can be kept 1000° C. without overshooting it. After then, the internal atmosphere temperature $T_I$ reaches the intended one 1000° C. and heat balance becomes stable. The fans 15 and 16 are thus operated stationary.

While keeping the wafer temperature $T_W$ 1000° C., reactive gas is supplied into the process tube 1 to diffuse impurities (elements) in the surface of each of the wafers W. After the heat diffusion process is finished, the process tube 1 is purged by $N_2$ gas. When it is cooled to room temperature (25° C., for example), the fans 15 and 16 are stopped and the wafer boat 5 is unloaded out of the process tube 1.

According to the above-described temperature control method, the depth of impurities diffusion in each of the wafers can be controlled with higher reproductivity. In addition, all of wafers W located in the process tube 1 at the upper, center and lower portions thereof can be uniformly heat-processed.

Further, the inside temperature $T_I$ in wafers-processing atmosphere is detected by the temperature detector means arranged adjacent to the wafers, and the heater means are controlled, while controlling amounts of air supplied and exhausted by the fan means, responsive to the temperature thus detected. Temperature control can be therefore attained to more quickly and accurately respond to the state of wafers which are cooled at high speed. The throughput and productivity of wafers processed can be thus increased.

Other embodiments of the present invention will be described referring to FIGS. 7 through 13.

Figure 8:
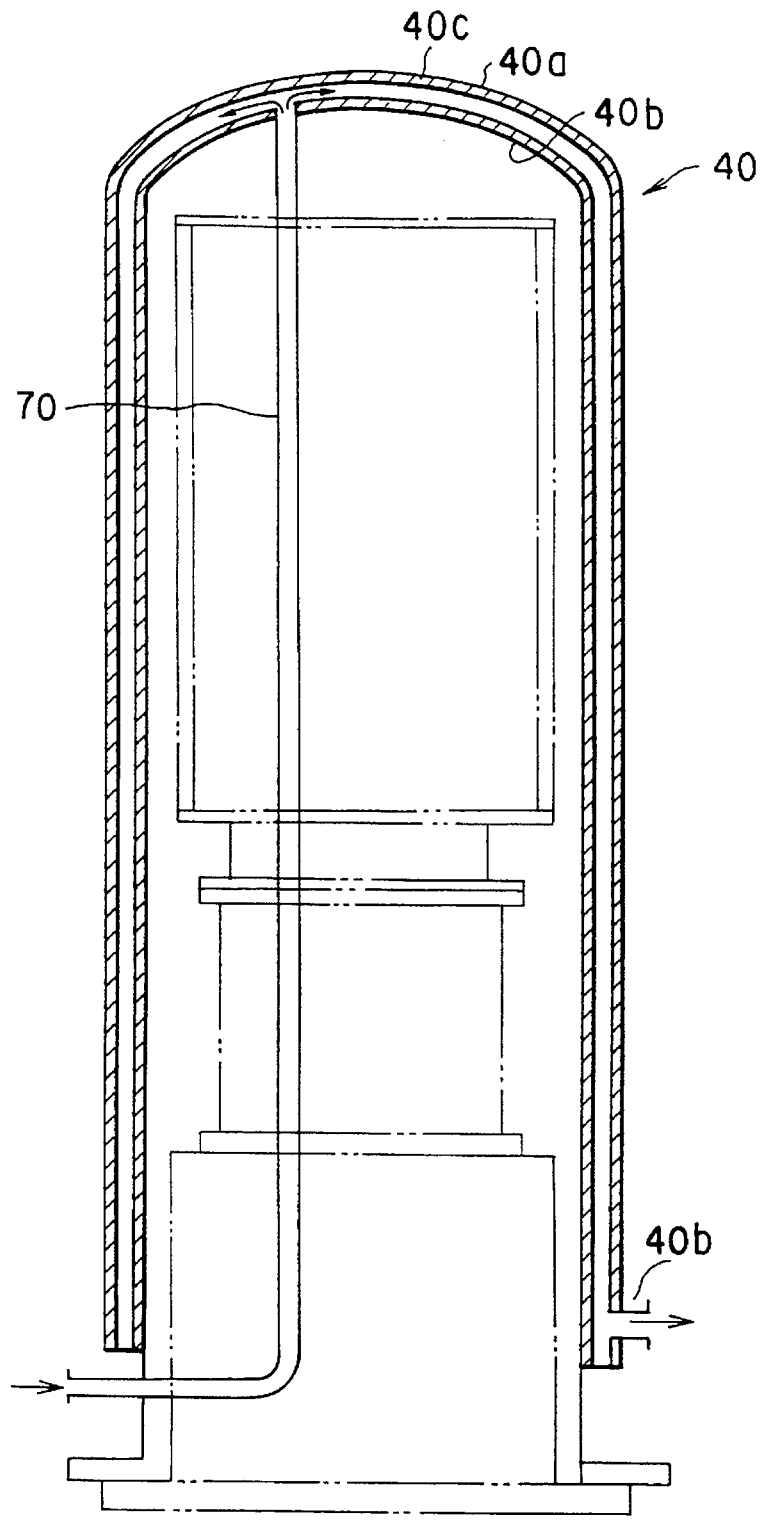
FIG. 8 is a sectional view showing a process tube in the third rapid heat treatment furnace.

FIG. 7 shows an oxidation diffusion furnace used to apply oxidation diffusion process to semiconductor wafers. A process tube 40 of this furnace is made of high purity quartz or sapphire to enable radiation heat waves such as infrared rays to easily pass through it but not to cause any unnecessary matters. A base plate (not shown) made of stainless steel is connected to an open end of the process tube 40. The tube 40 is thus supported by the base plate. It has double walls 40a and 40b and the inner wall 40b defines a process space 42. The boat 5 mounted on the heat insulating sleeve 11 is loaded into and unloaded out of the process space 42. The heat insulating sleeve 11 is mounted on the flange cap 12, which is attached to an elevator arm (not shown). The boat 5 is loaded into process tube 40 through an open bottom 41 thereof. The heat insulating sleeve 11 is connected to a rotary unit (not shown) which is provided with a belt 54. As shown in FIG. 8, the process tube 40 comprises outer and inner tubes 40a and 40b, and a space 40c is formed between the outer 40a and the inner tube 40b. The outer and inner tubes 40a and 40b are welded together on their bottom side to close the space 40c between them. Cleaning gas and exhaust pipes 70 and 40d are communicated with the space 40c. The pipe 70 is opened in the space 40c through the top of the inner tube 40b. The pipe 40d is opened, at one end thereof, in the space 40c through the lower portion of the outer tube 40a and communicated, at the other end thereof, with an exhaust unit (not shown).

The pipe 70 is communicated with cleaning gas supply sources (not shown) in which chlorine and oxygen gases are contained. Instead of chlorine gas, gases of the halogen group may be used as cleaning gas. Cleaning gas may be exhausted while being chemically reacted with metal ions. Metal ions may be exhausted together with nitrogen gas. Chlorine gas contained 1–10% in volume or oxygen gas having a flow rate of 5 m$^3$/minute is supplied from the cleaning gas source into the space 40c through the pipe 70. When the above-mentioned gases are mixed, they are supplied at a flow rate of 5–8 m$^3$/minute.

The timing at which gas is introduced into the space 40c through the pipe 70 is set at a time when metal ions are generated. It is set, for example, while temperature rise is being carried out in the process tube 40 or while process temperature is kept in it. Or it may be set every time the heat diffusion process is practiced. As metal ions must be caught and exhausted outside the space, however, it is desirable to avoid this gas introducing timing from being set at a temperature raising time when a few metal ions are generated or at a time when the boat 5 is loaded into and unloaded out of the process tube 40. This is intended to save the consumption of gas. It is also desirable that a clearance is formed between the process tube 40 and a heater element unit 56 and that coolant such as air is caused to flow through the clearance. In short, air is caused to flow from down to up in the clearance to forcedly cool the wafers W.

A pipe 50 communicated with a process gas supply source (not shown) is arranged in the process space 42. It is opened just under the top of the tube 40, extending from the bottom of the tube 40 to the top thereof along the inner wall 40b.

The heater element unit 56 is arranged round the process tube 40. A cylindrical insulator unit 58 further encloses the heater element unit 56 to support it. Inner and outer shells 62 and 64 are arranged round the cylindrical insulator unit 58. They house a cooling pipe 60 through which cooling medium is circulated.

The heater element unit 56 is consisted of parts 56a, 56b and 56c of top, center and bottom zones. These three parts 56a, 56b and 56c are temperature-controlled independently of the others by the temperature controller (not shown) to uniformly heat all of the wafers W located at the upper, center and lower portions of the tube 40. The insulator unit 58 is also consisted of three parts 58a, 58b and 58c, corresponding to the three parts 56a, 56b and 56c.

Figure 9:
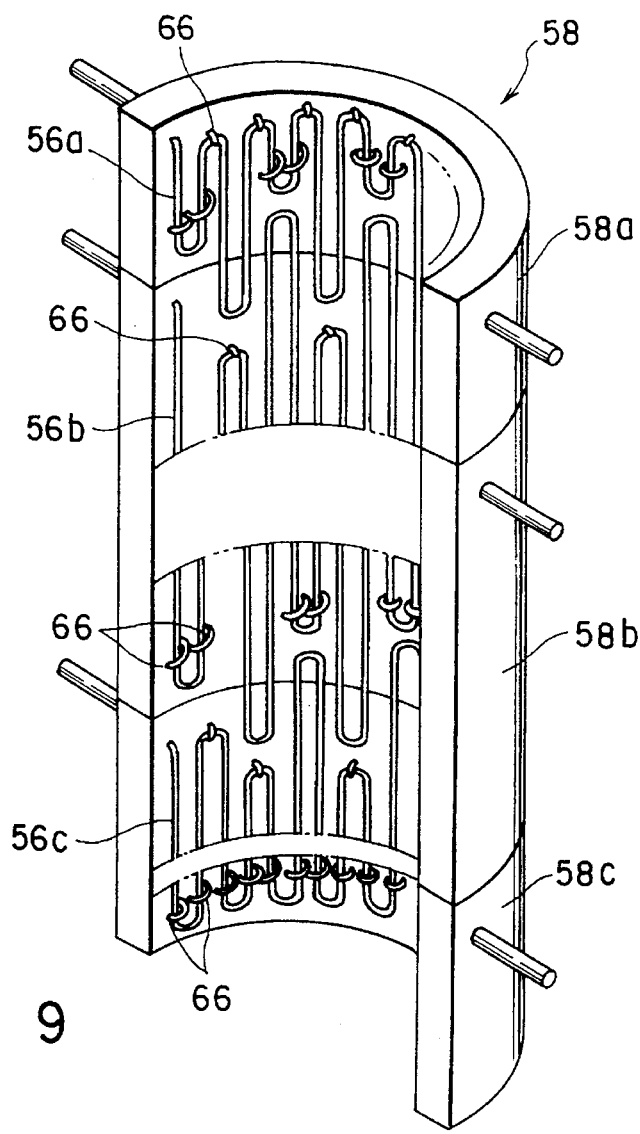
FIG. 9 is a perspective view showing heater elements arranged on the inner face of a heat insulator half.

As shown in FIG. 9, the insulators 58a, 58b and 58c are attached to a semi-circular half and these two halves are combined together to form the cylindrical insulator unit 58. The heater element unit 56 is also therefore formed by two halves to each of which the heater elements 56a, 56b and 56c are attached. It is desirable that the insulator unit 58 has a thickness smaller than 45 mm, more preferably of about 25 mm. The insulator unit 58 is desirably made as thin as possible to such an extent that it can keep its mechanical strength.

The heater elements 56a, 56b and 56c are made of molybdenum disilicide (MoSi$_2$). Heaters each having molybdenum disilicide (MoSi$_2$) as main composition (or Kanthal Super Heaters made by Kanthal Corporation) are used as the heater elements. This heater element made of molybdenum disilicide has quite a small resistance value at room temperature but its resistance value becomes larger at higher temperature. Preferably, it has a diameter larger than 1.5 mm but smaller than 6 mm. This is because high speed temperature rise and fall cannot be made as desired when its diameter becomes larger than 6 mm and because it is made likely to be broken when its diameter becomes smaller than 1.5 mm. It is the most appropriate that it is set to have a surface load of 10–30 W/cm$^2$ at 1200° C. To add more, the conventional FeCrAl heater element a permissible power per cm$^2$ of 2 W/cm$^2$ at 1200° C., but the MoSi$_2$ one can have a heat value several or several ten times larger than that of the conventional one. While the FeCrAl heater element had a temperature raising speed of 10° C./minute, therefore, the MoSi$_2$ one can have a temperature raising speed at least higher than 30° C./minute and of 100° C./minute, maximum.

As shown in FIG. 9, each of the heater elements 56a, 56b and 56c is a line material extending up and down along the inner wall of its corresponding zone while being bent like U at its top and bottom (which repeat U-turn shape is called meander-shape.

Figure 10:
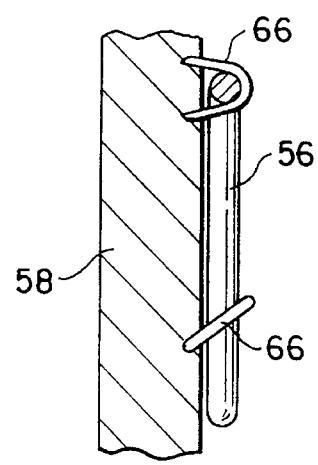
FIG. 10 is a partly-sectioned view showing how the heater element is attached to the inner face of the heat insulator half.

As shown in FIG. 10, each of meander-shaped heater elements 56a, 56b and 56c is attached to the inner face of its corresponding heat insulator 58a, 58b or 58c by staples 66. The staple 66 serves to attach each U-bent top of the line material to the inner wall, hanging the line material from it. However, the line material is left free from any of staples 66 at its each U-bent bottom but fixed to the inner wall at its linear portions by staples 66. This is intended to allow each of the elements 56a, 56b and 56c to expand and retract in the vertical direction at the time of heating process.

When the heater elements 56a, 56b and 56c are heated, silicon dioxide is deposited on their surfaces, serving as their protection film. This protect them from being broken. That surface of each staple 66 which is contacted directly with the heater elements 56a, 56b or 56c is coated in this case with material left inactive against silicon dioxide even at a high temperature of 1200° C., for example. This prevents the heater elements 56a, 56b and 56c from being broken at their portions with which the staples 66 are contacted. Iron (Fe), copper (Cu) and nickel (Ni), for example, can be used as staple coating material. The staple 66 itself may be made of one of them.

As shown in FIGS. 11 and 12, a plurality of wafers W are on the boat 5 at a same interval. Each wafer W is supported at its rim portion by a ring tray 54. The ring tray 54 comprises a wafer-mounted portion 54a and a side wall portion 54b. The height T$_2$ of this side wall portion 54b is equal to or larger than the width T of the wafer W. As shown by broken lines in FIG. 12, radiation heat shot from the heater to a wafer is shielded by two wafers adjacent to the radiation-shot wafer to thereby limit the amount of radiation heat reaching the center portion of it. The distance L$_1$ between two adjacent ring trays 54 is set so large that a carrier arm (not shown) can carry the wafer W onto and out of the wafer-mounted portion 54a of the ring tray 54. The width L$_2$ of the side wall portion 54b is set so large that the wafer W and the ring tray 54 cannot interfere with each other when they are expanded by heat.

FIG. 13 is a wafer temperature distribution diagram, in which positions from the wafer center are plotted along the horizontal axis and wafer temperatures along the vertical axis. A curve T$_R$ in FIG. 12 represents results obtained in the case of this embodiment (in which ring trays 54 are used) and another curve $T_N$ results obtained in the case of an comparison example (in which no ring tray is used). As apparent from FIG. 12, temperature uniformity in the wafer plane or surface is more excellent in the former than in the latter.

It will be described how the heat treatment apparatus shown in FIG. 7 is operated.

The boat 5 is loaded into the process tube 40, which is then exhausted. Power is applied to the heaters 56a, 56b and 56c to raise the temperature of each wafer W at high speed. It is preferable that the process space 42 is previously heated to a temperature lower than 600° C. before the boat 5 is loaded into the space 42. This is because the producing speed of oxidation film is low at the temperature lower than 600° C. When the producing speed of oxidation film is low, it is more advantageous in increasing the throughput of wafers. On the other hand, radiation heat shot from the heater unit 56 comes into the wafers W in the space 42, passing directly through the process tube 40. The temperature raising speed of wafers W can be therefore made higher than in the conventional case where the intermediate uniformly-heating member was used.

Cleaning gas is introduced into the space 40c through the pipe 70. When the heaters 56a, 56b and 56c are heated, silicon dioxide ($SiO_2$) is caused on the surface of each wafer and metal ions such as Fe, Cu, Ni and Na are also caused from the staples 66. These metal ions and other enter into the space 40c, passing through the outer tube 40a. They tray 54 to further pass through the inner tube 40b but they are prevented by cleaning gas and exhausted outside through the exhaust pipe 40d.

According to the above-described embodiment, cleaning gas itself can raise its temperature to increase its reaction to metal ions. The efficiency of catching metal ions can be thus increased. This effect appears more remarkably in the temperature lowering process and the above-mentioned supply of cleaning gas is more effective at least at the temperature lowering time.

According to this embodiment, each wafer is mounted, at its rim portion, on the ring tray. It can thus have heat capacity larger in its rim portion than in its center portion. Therefore, abnormal temperature rise in the rim portion of each wafer which is caused when radiation heat rays entering into the wafer are shielded by adjacent semiconductor wafers can be prevented. In addition, the temperature rise of each wafer can be more surely suppressed by shielding heat rays which enter into the rim portion of the wafer.

According to this embodiment, the heat insulator unit is made thinner than the conventional one. The process tube itself can thus have a smaller heat capacity. As the result, the rapid heat treatment furnace thus provided can make its temperature changing speed higher. To add more, the heat insulator used in the conventional heat treatment furnace had a thickness larger than 50 mm, although 25 mm in the case of this embodiment. When their difference is so large, the temperature rise of each wafer can be made faster in this embodiment while more effectively adding heat radiation shot from the heater directly to each wafer.

The heat treatment apparatus of the vertical type according to a further embodiment of the present invention will be described referring to FIGS. 14A, 14B, 15 and 16.

As shown in FIG. 14A, a heat treatment apparatus 80 of the vertical type includes a process tube 82, a heater 84 and a manifold 86. The process tube 82 comprises outer and inner tubes 122 and 124 which are coaxially arranged each other. The heater 84 encloses the outer tube 122.

Figure 15:
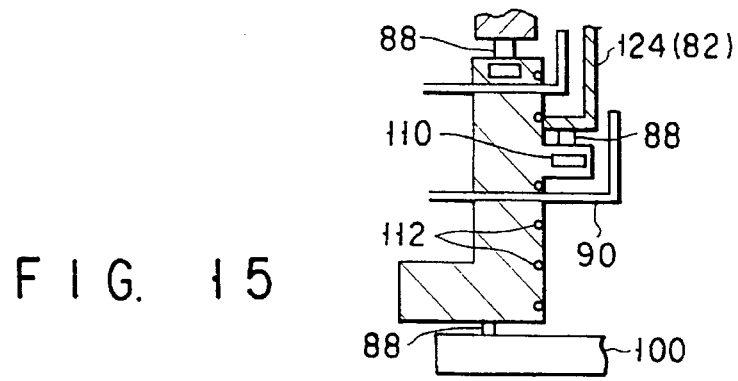
FIG. 15 is a partly-sectioned view showing a bottom portion of the heat treatment apparatus enlarged.

As shown in FIG. 15, the manifold 86 supports the process tube 82 through O-rings 88 which are arranged under bottom ends of outer and inner tubes 122 and 124. A process gas pipe 90, a purge gas pipe 92 and an exhaust pipe 94 are connected to the manifold 86.

A boat elevator 98 is arranged under the manifold 86, supporting the boat 5 on it. A cap member 102 is attached to an elevator arm 100 of the boat elevator 98, facing the open bottom of the manifold.

The elevator arm 100 is also provided with a table 104 above the cap member 102. The heat insulating sleeve 11 is mounted on the table 104 and the boat 5 is supported on the top of the heat insulating sleeve 11. The cylindrical wall of the manifold 86 and the cap member 102 of the elevator arm 100 are made of aluminium or aluminium alloy. They define a sealed region in which uniform heat transmission can be guaranteed. A heater may be attached to the cap member 102 to heat it if necessary. Cooling medium passages 110 are formed in the wall of the manifold 86 to cool O-rings.

The surface of the manifold 86 is coated with coating material of the silicon group by the electrolytic deposition manner such as electrolytic plating. The coating material serves to prevent each wafer from being contaminated by heavy metal and it is silicon dioxide ($SiO_2$). Thin aluminium oxide film is formed on the surface of the manifold. However, this thin aluminium oxide file is not sufficient to protect the manifold 86 when the manifold 86 is under contact with high temperature process gas. It may be arranged, therefore, that the surface of the manifold 86 is alumite-processed and coated with $SiO_2$, $Al_2O_3$, SiC and $Si_3N_4$ may be used, instead of $SiO_2$, as manifold coating material.

As shown in FIG. 14B, temperature gradient is caused in the longitudinal direction of the apparatus. As shown by a temperature curve $T_2$, the manifold becomes lower in temperature than the upper portion of the process tube in the conventional case. Process temperature in process atmosphere is thus made non-uniform because heat is discharged through the manifold. Temperature in each of the uniformly-heating zones becomes unstable accordingly. When it is not stable, temperature needed to form film on each wafer also becomes non-uniform. This means that film forming condition relative to one wafer becomes different from that relative to the other wafer.

As shown by another temperature curve $T_1$, the manifold 86 can be held 150° C. in the case of the above-described apparatus according to the present invention. This is because the manifold 86 is provided with a temperature adjusting unit. A sheath heater embedded in the cylindrical wall of the manifold 86 serves as the temperature adjusting unit. It is flexible. In addition, the surface of the manifold 86 is coated with silicon dioxide. Therefore, the generating of heavy metal ions can be more reliably prevented.

Figure 16:
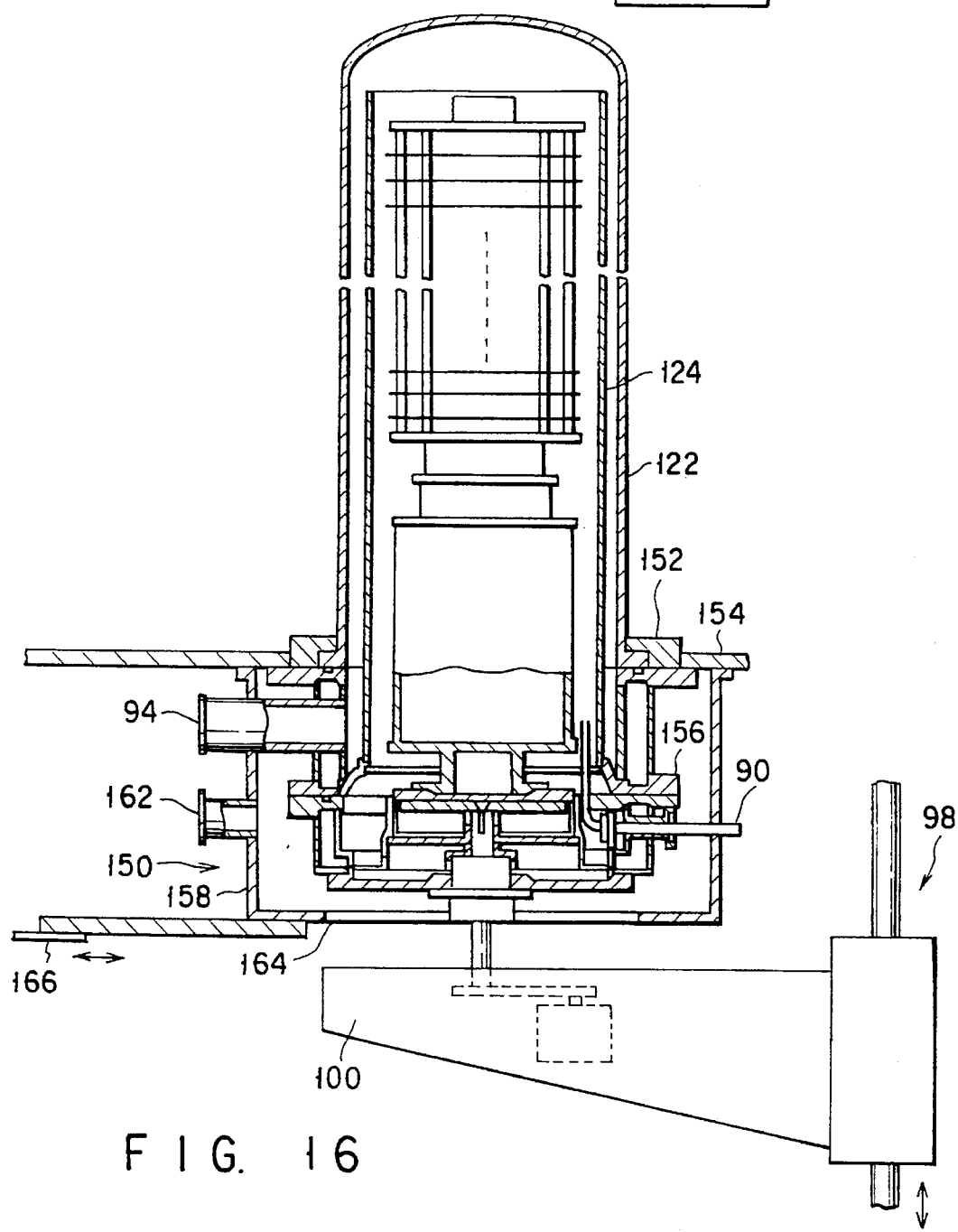
FIG. 16 is a sectional view showing the heat treatment apparatus according to a still further embodiment of the present invention.

A scavenger unit 150 may be arranged round the manifold, as shown in FIG. 16. This scavenger unit 150 is disclosed in Jpn. Pat. Appln. KOKAI Publication No. Hei 2-87618. The outer tube 122 is fixed to a base plate 154 through an outer manifold 152. The inner tube 124 is fixed to the bottom end of the outer manifold 152 through an inner manifold 156.

A scavenger body 158 which is shaped like a cylindrical basin is arranged under the base plate 154, enclosing outer circumferences and bottoms of the outer and inner manifolds 152 and 156. It is made of metal alloy of the aluminium group. The components 152, 154, 156 and 158 are coated with silicon dioxide ($SiO_2$).

An exhaust opening 162 is formed in the side wall of the scavenger body 158 and an opening 164 which is opened when a boat elevator 98 is moved up and down is formed in the bottom thereof. The opening 164 is opened and closed by a shutter 166, which is made of metal of the aluminium group and coated with silicon dioxide.

Temperature distribution round the manifold unit can also be made uniform in this case.

The rapid heat treatment apparatus according to a still further embodiment of the present invention will be described with reference to FIGS. 17 and 18.

In this rapid heat treatment apparatus, a heater 14b is attached around a manifold 211 and the cap member 12. Another heater 14a is also attached around the supply and exhaust pipes 9 and 10. Each of the heaters 14a and 14b is shaped like a sheet and they are connected to a power source 14c. They may be previously attached to the manifold 211, the cap member 12 and others or they may be attached to the pipes 9, 10 and others every time the heat diffusion process is conducted. A cooling medium passage 12b is formed in the cap member 12 and it is communicated with a cooling water tank 232 through a switch valve 230 and a pump 231.

Figure 18:
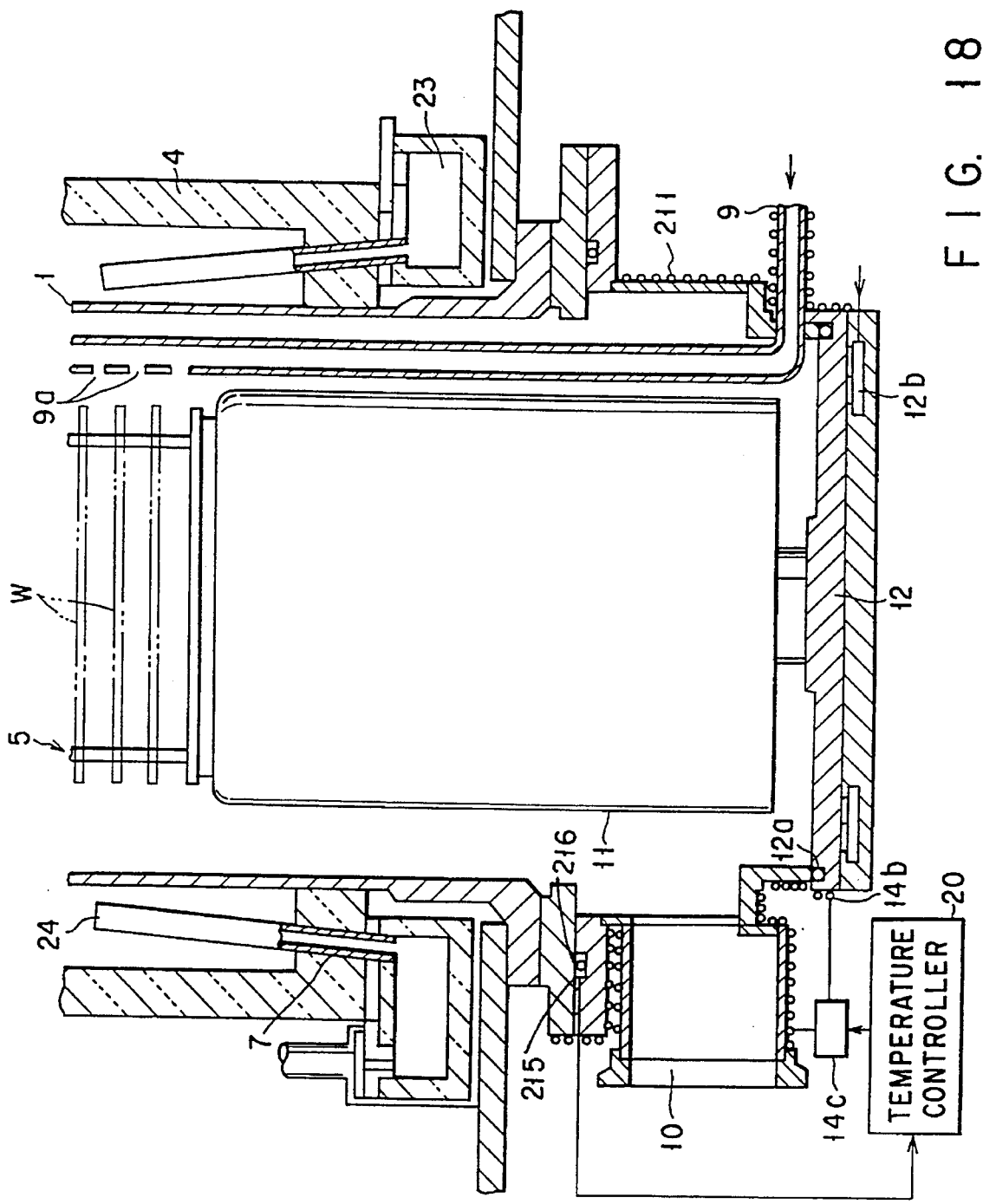
FIG. 18 is a partly-sectioned view showing a bottom portion of the heat treatment apparatus enlarged.

As shown in FIG. 18, the heater power source 14c is controlled by the temperature controller 20. A thermocouple 215 is connected to the input side of the temperature controller 20. It is arranged adjacent to an O-ring 216. When detection signal is applied from it to the temperature controller 20, command signal is sent from the temperature controller 20 to the power source 14c to heat the manifold 211 to a temperature range of 150° C.–200° C. by the heaters 14a and 14b. The reason why the temperature of the manifold 211 heated is limited in this range of 150° C.–200° C. resides in that reaction products are prevented from adhering to inner faces of the manifold 211 and cap member 12 and that O-rings 216 and 12a are prevented from being broken by heat. The heaters 14a and 14b may be embedded in the pipes 9, 10, the manifold 211 and the cap member 12. As shown by a two-dot and dash line in FIG. 17, the switch valve 230 of the coolant supply line can be controlled by the temperature controller 20. This can prevent the cap member 12 from being heated higher than the intended temperature.

The rapid heat treatment apparatus according to a still further embodiment of the present invention will be described with reference to FIGS. 19 through 21.

In the rapid heat treatment apparatus, it is needed that a large amount of cooling air is introduced into the space 2 through supply openings 7 and then exhausted outside through the exhaust opening 8, for the purpose of heating the process tube 1 to about 1000° C. and then quickly cooling it to about 500° C. and further to room temperature (about 25° C.). Conventionally, clean air in the clean room was used for the forced-cooling. The air cleaning system was thus made large in size. In addition, clean air used was only exhausted outside the factory and not used again. This was a waste of energy.

In the rapid heat treatment apparatus of the present invention, therefore, a clean air circulation circuit is provided to more efficiently use process-tube-cooling clean air. The air circulation circuit comprises a duct 320, a flow rate detector 326, a filter 327 and a pipe 329. The duct 320 extends from the exhaust opening 8 to the flow rate detector 326 and the pipe 329 extends from the flow rate detector 326 to the supply openings 7. Another pipe 325 branches from the pipe 329 and it includes an air take-in switch valve 324. The flow rate detector 326 is connected to a drive section of the switch valve 324. When the switch valve 324 is opened, clean air is newly taken into the circulation circuit. The shutter 13a is attached to the supply openings 7 and the shutter 13b to the exhaust opening 8. The duct 320 is provided with a heat exchanger 321 and a fan 316. The heat exchanger 321 is controlled by the temperature controller 20. A thermocouple 328 is connected to the input side of the temperature controller 20. It is arranged in the duct 320 downstream the heat exchanger 321.

It will be described how the above-described rapid heat treatment apparatus is operated.

The shutters 13a and 13b are closed and the boat 5 is loaded into the process tube 1. The inside of the process tube 1 is heated to a temperature (1000° C., for example) higher than 500° C. The shutters 13a and 13b are then opened to communicate the space 2 with the air circulation circuit through the supply and exhaust openings 7 and 8. The fans 15 and 316 are driven. Cooling air is thus introduced into the space 2 so that the process tube 1 and the wafers W can be forcedly cooled to about 500° C. Their temperatures are temporarily kept about 500° C. Air exhausted is cooled through the heat exchanger 321 and impurities and duct are then removed from it through the filter 327. It is again returned into the space 2.

When the flow rate of air in the circulation duct 320 and pipe 329 becomes low, the switch valve 324 is opened responsive to detection signal applied from the flow rate detector 326. Air in the clean room can be thus added into the circulation duct 320 and pipe 329.

The wafers are diffusion-process while keeping them at the intended temperature as described above. When the diffusion process is finished, the heater power source is turned off and nitrogen gas is introduced into the process tube 1 to purge it. When temperature in it is cooled to the intended one (25° C.), the boat 5 is lowered and the wafers W are taken out of the boat 5.

Figure 20:
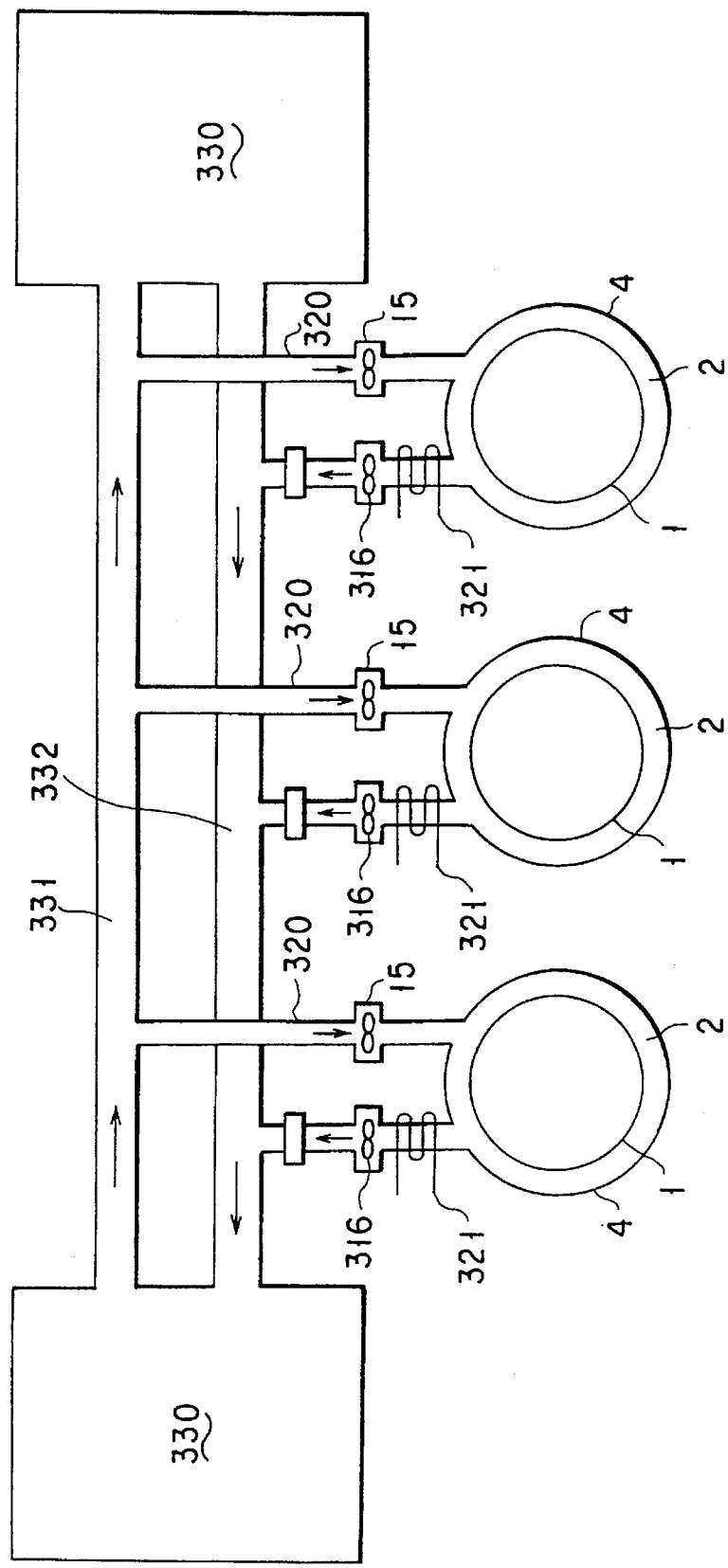
FIG. 20 is a view showing a cooling system of the heat treatment apparatus.

As shown in FIG. 20, two heat exhaust lines 331 and 332 may be interposed between two clean rooms 330 and circulation ducts 320 may be connected to them. They are arranged independently of the exhaust line in the factory.

Figure 21:
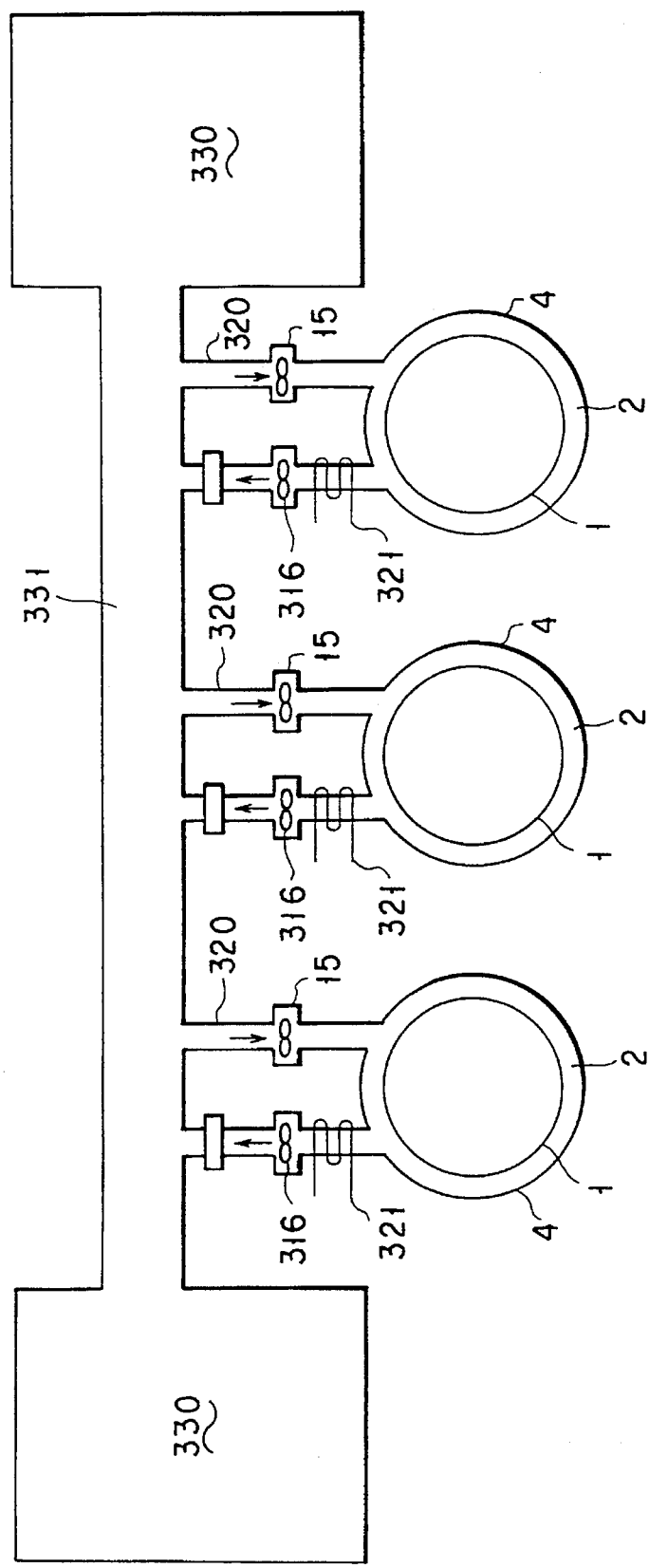
FIG. 21 is a view showing another cooling system of the heat treatment apparatus.

As shown in FIG. 21, only one heat exhaust line 333 may be interposed between two clean rooms 330. When these heat exhaust lines 331, 332 and 333 are used, cooling air can be made common to plural heat treatment apparatuses.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A temperature control method in a rapid heat treatment apparatus to rapidly and uniformly heat-process a plurality of substrates comprising:

heating dummy substrates in a process tube by plural heater means and previously detecting by temperature detector means a substrate temperature rising pattern obtained in each of a plurality of zones until the dummy substrates reach an intended temperature, a heater temperature rising pattern obtained in each of the zones until heat generating portions of said heater means reach the intended temperature, and also an internal atmosphere temperature rising pattern obtained in each of the zones until an atmosphere in the process tube reaches the intended temperature;

arranging substrates to be processed in the process tube;

detecting a temperature of each of the zones in the process tube and temperature of the heat generating portion of each heater means by the temperature detector means, upon heating the substrates; and controlling each of the heater means on the basis of the detected temperatures, said substrate temperature rising pattern, said heater temperature rising pattern and said internal atmosphere temperature rising pattern by a control means to rapidly and uniformly raise the temperature of each substrate until the temperature of the substrates in each of the zones reaches the intended one and becomes stable.

2. The temperature control method according to claim 1, wherein the amount of power supplied to the heat generating portion of each heater means is increased on the basis of the detected temperatures and the substrate temperature rising patterns to rapidly heat the substrates to the intended temperature.

3. The temperature control method according to claim 1, wherein three temperature detector means are arranged adjacent to the substrates in the process tube, temperatures of upper, center and lower zones in the process tube are detected by the temperature detector means and the amount of power supply to the heat generating portion of the heat means in one of the zones is set larger than the amount of power supplied to the heat generating portions of the heat means in other of the zones.

4. The temperature control method according to claim 1, further comprising the steps of, sending a cooling gas into a space between the process tube and an outer chamber by a fan means and controlling the heating of each of the zones in the process tube by the heater means to make the temperature falling speed of each substrate certain.

5. The temperature control method according to claim 4, further comprising the steps of, circulating the cooling gas between the space and the fan means through a gas circulating means.

6. The temperature control method according to claim 4, wherein respective to the detected temperature in each of the zones, the fan means is controlled by the control means.

7. The temperature control method according to claim 1, wherein the heat generating portions of the heater means are arranged round the process tube so as to heat the process tube from outside.

8. The temperature control method according to claim 1, further comprising the step of, changing an amount of power supplied to each heater means by a power varying means of the control means.

9. The rapid heat treatment apparatus for rapidly heating semiconductor wafer comprising:

a process tube, made of a non-metallic material, having a lower opening through which a semiconductor wafer boat is inserted;

a manifold unit air-tightly connected via a sealed portion to said lower opening of the process tube, having a gas inlet portion, and made of aluminum or an aluminum alloy;

a supply source for supplying a gas into said process tube through said gas inlet portion;

a section for exhausting gas out of the process tube;

heating means arranged around said manifold unit for heating the manifold unit;

temperature control means for measuring a temperature of the manifold unit, controlling the operation of said heating means based on the measured temperature of the manifold unit, and controlling the temperature of the manifold unit; and a $SiO_2$ layer formed by electrolytic deposition matter to control the inner surface of the manifold unit.

10. The rapid heat treatment apparatus according to claim 9 wherein a process gas used for the heat treatment of said semiconductor wafer and/or a cleaning gas for removing foreign matters deposited on the inner wall of the process tube are introduced from said gas supply source into the process tube through the gas inlet portion of said manifold unit.

11. The rapid heat treatment apparatus according to claim 9, wherein metal-ions-reactive gases of the halogen group, oxygen gas and air are used as supply gas.

12. The rapid heat treatment according to claim 9, wherein non-reactive gases such as nitrogen and argon ones are used as supply gas.

13. The rapid heat treatment apparatus according to claim 9, wherein supply gas is supplied at least when the temperature of the resistance heater element is higher than a predetermined set point.

14. The rapid heat treatment apparatus according to claim 9, wherein said boat includes ring-shaped trays on which the substrates are supported at their rim portions, and each tray has a side wall extending along the rim of the substrate and having a height equal to or larger than the top of the substrate when the substrate is mounted on the tray.

15. The rapid heat treatment apparatus according to claim 9, wherein said $SiO_2$ layer also contains $Al_2O_3$, SiC and $Si_3N_4$.

16. A rapid heat treatment apparatus for rapidly heating semiconductor wafer comprising:

a process tube, made of a non-metallic material, having multiple zones and an opening through which a semiconductor wafer boat is inserted;

heater means having heat generating portions for heating dummy substrates in the process tube;

temperature detector means for detecting (a) a substrate temperature rising pattern obtained in the multiple zones until the dummy substrates reach an intended temperature, (b) a heater temperature rising pattern obtained in the zones until heat generating portions of said heater means reach the intended temperature, and (c) an internal atmosphere temperature rising pattern obtained in the zones until an atmosphere in the process tube reaches the intended temperature, and for detecting a temperature of each of the zones in the process tube and the temperature of the heat generating portions of the heater means, upon heating the substrates;

a controller means for controlling the heater means on the basis of the detected temperatures, the substrate temperature rising pattern, the heater temperature rising pattern and the internal atmosphere temperature rising pattern to rapidly and uniformly raise the temperature of each substrate until the temperature of the substrates in the zones reaches the intended temperature.

* * * * *